(12) United States Patent
Li et al.

(10) Patent No.: US 9,954,516 B1
(45) Date of Patent: Apr. 24, 2018

(54) TIMING DEVICE HAVING MULTI-PURPOSE PIN WITH PROACTIVE FUNCTION

(71) Applicant: Integrated Device Technology, Inc., San Jose, CA (US)

(72) Inventors: Hui Li, Fremont, CA (US); Teck Chuan Ng, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 490 days.

(21) Appl. No.: 14/830,698

(22) Filed: Aug. 19, 2015

(51) Int. Cl.
*H03K 3/03* (2006.01)
*H03L 7/099* (2006.01)
*H03B 5/32* (2006.01)

(52) U.S. Cl.
CPC .............. *H03K 3/0307* (2013.01); *H03B 5/32* (2013.01); *H03L 7/099* (2013.01)

(58) Field of Classification Search
CPC ........... H03L 7/00; H03K 17/099; H03B 5/32
See application file for complete search history.

(56) References Cited

U.S. PATENT DOCUMENTS

| | | | |
|---|---|---|---|
| 4,684,941 A | | 8/1987 | Smith et al. |
| 4,862,485 A | | 8/1989 | Guinea et al. |
| 4,931,748 A | * | 6/1990 | McDermott ....... G01R 29/0273 331/1 A |
| 5,155,451 A | * | 10/1992 | Gladden ................... H03L 7/10 327/105 |
| 5,388,060 A | | 2/1995 | Adams et al. |
| 5,410,572 A | * | 4/1995 | Yoshida ..................... H03L 7/14 331/14 |
| 5,663,105 A | | 9/1997 | Yu et al. |
| 5,673,004 A | * | 9/1997 | Park .......................... H03L 7/08 327/156 |
| 5,748,949 A | | 5/1998 | Johnston et al. |
| 5,757,240 A | | 5/1998 | Boerstler et al. |
| 5,848,355 A | | 12/1998 | Rasor et al. |
| 5,903,195 A | | 5/1999 | Lukes et al. |

(Continued)

OTHER PUBLICATIONS

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

(Continued)

*Primary Examiner* — Jeffrey Shin
(74) *Attorney, Agent, or Firm* — Glass & Associates; Kenneth Glass (57) ABSTRACT

A timing device that includes an OTP NVM, a first periodic signal generator operable to generate a periodic signal having a first frequency, a second periodic signal generator operable to generate a periodic signal having a frequency that is lower than the first frequency, and selection logic. In a first operating mode, the selection logic is configured to output the first periodic signal at an output terminal as long as a crystal clock feedback signal is received at the input terminal and output the second periodic signal when the crystal clock feedback signal is not received at the input terminal. In a second operating mode, the selection logic is configured to output the first periodic signal as long as a output enable signal is received at the input terminal and not provide any output at the output terminal when the output enable signal is not received at the input terminal.

20 Claims, 6 Drawing Sheets

(56) References Cited

U.S. PATENT DOCUMENTS

| | | |
|---|---|---|
| 6,219,797 B1 | 4/2001 | Liu et al. |
| 6,259,327 B1 | 7/2001 | Balistreri et al. |
| 6,640,311 B1 | 10/2003 | Knowles et al. |
| 6,643,787 B1 | 11/2003 | Zerbe et al. |
| 6,650,193 B2 | 11/2003 | Endo et al. |
| 6,683,506 B2 | 1/2004 | Ye et al. |
| 6,727,767 B2 | 4/2004 | Takada et al. |
| 6,768,387 B1 | 7/2004 | Masuda et al. |
| 6,870,411 B2 | 3/2005 | Shibahara et al. |
| 6,959,066 B2 | 10/2005 | Wang et al. |
| 7,012,476 B2 | 3/2006 | Ogiso et al. |
| 7,323,916 B1 | 1/2008 | Sidiropoulos et al. |
| 7,405,594 B1 | 7/2008 | Xu et al. |
| 7,434,083 B1 | 10/2008 | Wilson et al. |
| 7,541,848 B1 | 6/2009 | Masuda et al. |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,714,565 B2 | 5/2010 | Abuhamdeh et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,756,197 B1 | 7/2010 | Ferguson et al. |
| 7,786,763 B1 | 8/2010 | Bal et al. |
| 7,800,422 B2 | 9/2010 | Lee et al. |
| 7,816,959 B1 | 10/2010 | Isik et al. |
| 7,882,404 B2 | 2/2011 | Dai et al. |
| 7,885,612 B2 * | 2/2011 | Osada ............... H03L 7/0995 331/1 A |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,010,072 B1 | 8/2011 | Nathawad |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,432,231 B2 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Wright et al. |
| 9,077,386 B1 | 7/2015 | Holden et al. |
| 9,100,232 B1 | 8/2015 | Hormati et al. |
| 9,112,517 B1 | 8/2015 | Lye et al. |
| 9,455,854 B2 | 9/2016 | Gao |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana et al. |
| 2005/0170787 A1 | 8/2005 | Yamamoto et al. |
| 2006/0103436 A1 | 5/2006 | Saitou et al. |
| 2006/0119402 A1 | 6/2006 | Thomsen et al. |
| 2006/0197614 A1 | 9/2006 | Roubadia et al. |
| 2006/0229018 A1 | 10/2006 | Mlinarsky et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0128242 A1 | 5/2009 | Fitzgibbon et al. |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai et al. |
| 2010/0090731 A1 | 4/2010 | Casagrande et al. |
| 2010/0109714 A1 | 5/2010 | Lindfors et al. |
| 2010/0164761 A1 | 7/2010 | Wan et al. |
| 2010/0194483 A1 | 8/2010 | Storaska et al. |
| 2010/0240323 A1 | 9/2010 | Qiao et al. |
| 2010/0323643 A1 | 12/2010 | Ridgers et al. |
| 2011/0006936 A1 | 1/2011 | Lin et al. |
| 2011/0032013 A1 | 2/2011 | Nelson et al. |
| 2011/0095784 A1 | 4/2011 | Behel et al. |
| 2011/0234204 A1 | 9/2011 | Tamura et al. |
| 2011/0234433 A1 | 9/2011 | Aruga et al. |
| 2011/0264435 A1 | 10/2011 | Jamnejad et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0043999 A1 | 2/2012 | Quevy et al. |
| 2012/0161829 A1 | 6/2012 | Fernald et al. |
| 2012/0200330 A1 | 8/2012 | Kawagoe et al. |
| 2012/0249207 A1 | 10/2012 | Natsume et al. |
| 2012/0262315 A1 | 10/2012 | Kapusta et al. |
| 2012/0293221 A1 | 11/2012 | Ma et al. |
| 2012/0297231 A1 | 11/2012 | Qawami et al. |
| 2012/0317365 A1 | 12/2012 | Elhamias et al. |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1 | 11/2013 | Thirugnanam et al. |
| 2014/0021990 A1 | 1/2014 | Na et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0028960 A1 | 1/2015 | Yorita |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1 | 7/2015 | Ihm et al. |
| 2016/0013796 A1 | 1/2016 | Choi |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"19-Output PCIE Gen 3 Buffer", Si53019-A01A, Silicon Laboratories Inc., Rev. 1.1 May 2015, 34 Pages.

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamplesis Phase-Locked Loops", IEEE Journal of Solid-State Circuits, vol. 37 No. 10, Oct. 2002, pp. 1331-1334.

(56) References Cited

OTHER PUBLICATIONS

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

TIMING DEVICE HAVING MULTI-PURPOSE PIN WITH PROACTIVE FUNCTION

BACKGROUND OF THE INVENTION

Conventional integrated circuits include a clock input pin for receiving a clock signal from an integrated circuit timing device or include an input pin that connects to a piezoelectric crystal and an output pin that provides a feedback clock signal to the piezoelectric crystal. In order to meet the needs of these two types of integrated circuits a wide range of integrated circuit timing devices have been developed.

In many cases a system may start with an integrated circuit that connects to a piezoelectric crystal and then subsequent products may move up to a more sophisticated integrated circuit that requires a more complex and more accurate integrated circuit timing device. In these instances, the system manufacturer must first design a system that includes a piezoelectric crystal and implement connections to the piezoelectric crystal and then later redesign the system to accommodate a conventional integrated circuit timing device.

This adds expense to the product upgrade process that would be unnecessary if a single integrated circuit timing device could be used both as a replacement for a piezoelectric crystal and as a conventional integrated circuit timing device. Accordingly, there is a need for a single integrated circuit timing device that can be used both as a replacement for a piezoelectric crystal and as a conventional integrated circuit timing device.

SUMMARY OF THE INVENTION

A timing device is disclosed that includes an input terminal, an output terminal and a one time programmable non-volatile memory (OTP NVM) that is operable to receive configuration data and burn the configuration data into the OTP NVM so as to store the configuration data in the OTP NVM. A first periodic signal generator is operable to generate a first periodic signal having a first frequency and a second periodic signal generator is operable to generate a second periodic signal having a second frequency that is lower than the first frequency. Selection logic is electrically coupled to the input terminal, the output terminal, the OTP NVM, the first periodic signal generator and the second periodic signal generator. The selection logic is configured to receive configuration data read from the OTP NVM. When the configuration data indicates a proactive (first) operating mode the selection logic is configured to output the first periodic signal at an output terminal as long as a crystal clock feedback signal is received at the input terminal and output the second periodic signal when the crystal clock feedback signal is not received at the input terminal. When the configuration data indicates a normal (second) operating mode the selection logic configured to output the first periodic signal as long as a output enable signal is received at the input terminal and not provide any output at the output terminal when the output enable signal is not received at the input terminal.

A clock distribution system is disclosed that includes a timing device and a first integrated circuit device that is either an integrated circuit device having a crystal driver input terminal and crystal driver output terminal or an integrated circuit device having a clock input terminal and not having a crystal driver output terminal.

In an embodiment in which the first integrated circuit device includes a crystal driver input terminal and a crystal driver output terminal, the output terminal is electrically coupled to the crystal driver input terminal and the input terminal is electrically coupled to the crystal driver output terminal. In this embodiment the configuration data indicates a proactive operating mode and the selection logic is configured to output the first periodic signal at an output terminal as long as a crystal clock feedback signal is received at the input terminal and output the second periodic signal when the crystal clock feedback signal is not received at the input terminal.

In an embodiment in which the first integrated circuit device has a clock input terminal and does not have a crystal driver output terminal, the output terminal is electrically coupled to the clock input terminal and the input terminal is electrically coupled to receive an output enable signal. In this embodiment the configuration data indicates the normal operating mode and the selection logic is configured to output the first periodic signal as long as an output enable signal is received at the input terminal and not provide any output at the output terminal when the output enable signal is not received at the input terminal.

Accordingly, the timing device of the present invention can be used both as a crystal replacement clock and as a conventional integrated circuit clock and includes a single input terminal that receives the crystal clock feedback signal when the timing device is used as a crystal replacement clock and receives the output enable signal when the timing device is used as a conventional integrated circuit clock. The use of a single input terminal reduces pin count, reducing overall cost and allowing expanded functionality in a small package. Moreover, the timing device of the present invention provides power savings in the first operating mode by automatically switching to the second periodic clock generator (that operates at a lower frequency and duty cycle) when the integrated circuit device that it is connected to is powered off. Furthermore, power savings are obtained in the second operating mode as the clock enters a maximum power savings mode when the operation enable signal is deasserted.

DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
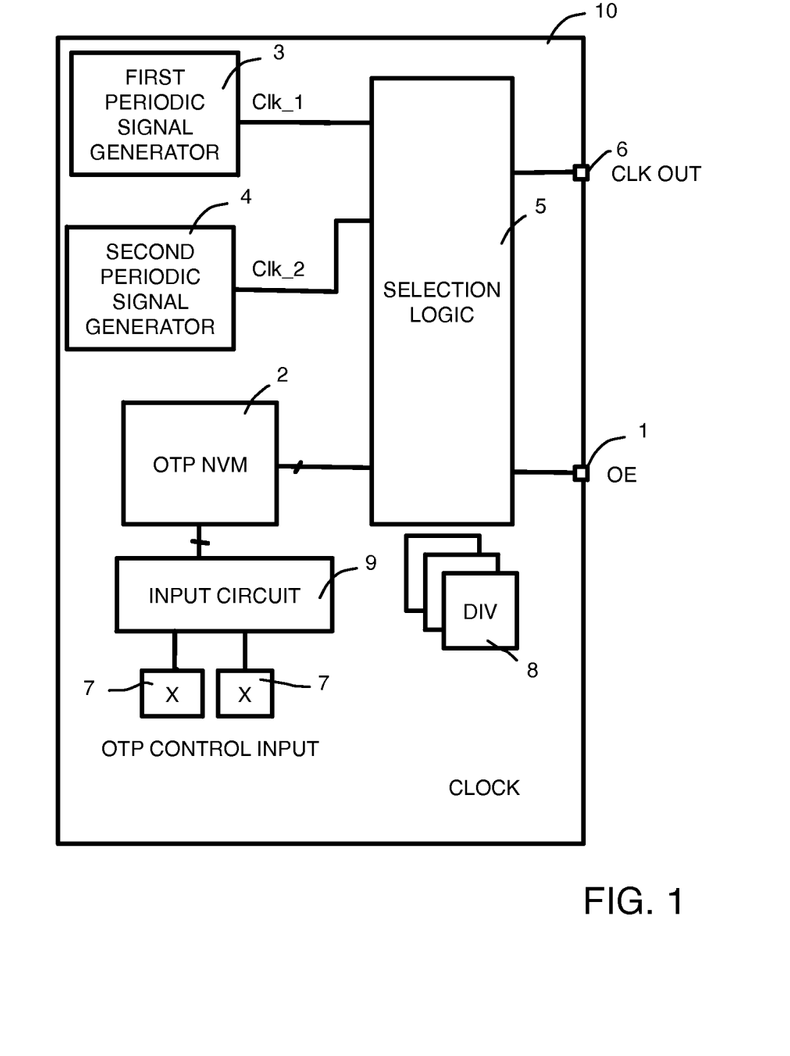
FIG. 1 is an illustration of a timing device in accordance with an embodiment of the present invention.

FIG. 1 illustrates a timing device 10 that includes input terminal 1, output terminal 6 and one time programmable non volatile memory (OTP NVM) 2 data storage device. OTP NVM 2 is a non-volatile memory array that includes programmable fuses and/or antifuses that can be programmed for one-time-storage in the OTP NVM memory array.

Timing device 10 also includes OTP control inputs 7 that are electrically coupled to an input circuit 9 for providing additional input to timing device 1. Input circuit 9 is electrically coupled to OTP NVM 2 and can be an Inter-IC ($I^2C$) interface or a system management bus (SMB) interface or other interface that allows for coupling data to and programming of OTP NVM 2.

Periodic signal generator 3 (first periodic signal generator) is operable to generate a first periodic signal (Clk_1)) having a first frequency ($f_1$) at an output thereof. Periodic signal generator 4 (second periodic signal generator) is operable to generate a second periodic signal (Clk_2) having a second frequency ($f_2$) at an output thereof, where frequency $f_2$ is lower than frequency $f_1$. In one embodiment the first frequency is in the megahertz range and the second frequency is between 1 KHz and 40 KHz. The duty cycle of the second periodic signal is less than the duty cycle of the first periodic signal. The second periodic signal may have, for example, a duty cycle less than 50%.

In the present embodiment a low power low frequency oscillator is used to generate a low frequency periodic signal having a low duty cycle. In one embodiment second periodic signal generator 4 includes a low power low frequency oscillator (e.g., a low power digitally controlled oscillator (DCO)) that generates a low frequency periodic signal having a low duty cycle that is electrically coupled to a one input of a NAND gate and to an input of a delay element (inverter) having an output electrically coupled to the other input of the NAND gate to generate a low frequency pulse train at the output of second periodic signal generator 2 as is illustrated in U.S. Pat. No. 8,854,085, titled "Clock Distribution Systems for Low Power Applications, by Jagdeep Bal and Cheng Wen Hsiao, issued on Oct. 7, 2014, which is incorporated herein by reference in its entirety.

Figure 2:
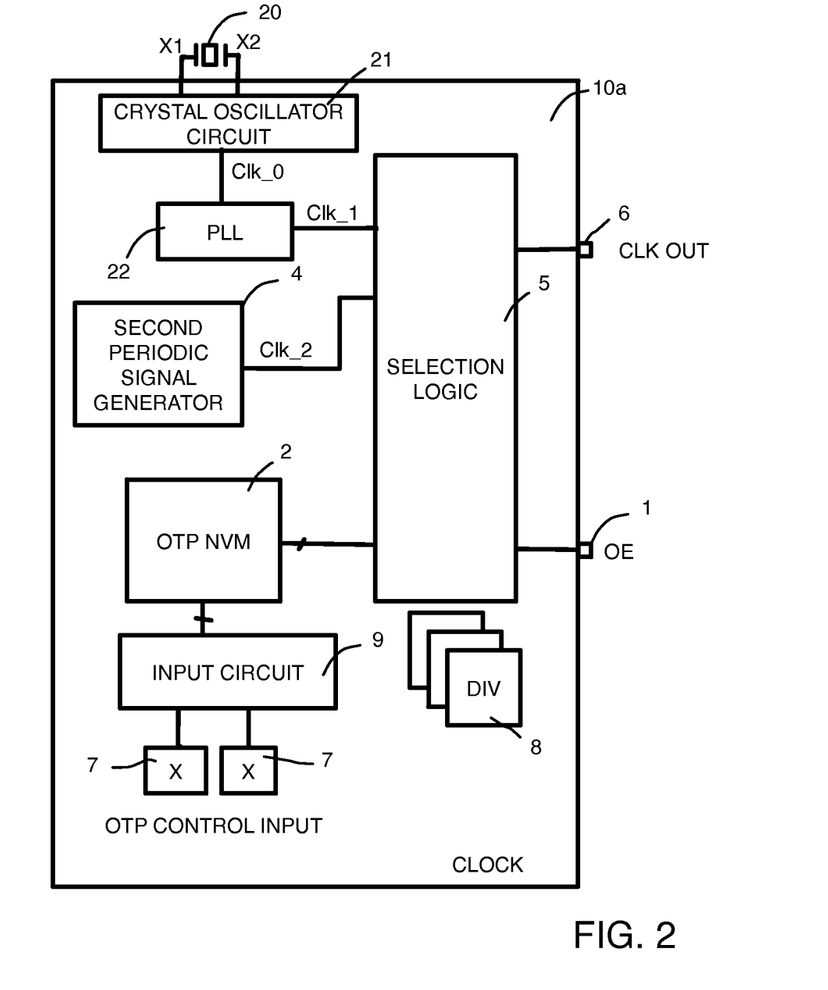
FIG. 2 is an illustration of a timing device having a piezoelectric crystal in accordance with an embodiment of the present invention.

In an embodiment that is illustrated in FIG. 2 first periodic signal generator 3 includes a piezoelectric crystal 20 and a crystal oscillator circuit 21 configured to oscillate piezoelectric crystal 20 so as to generate an internal clock signal (Clk_0). In one embodiment crystal oscillator circuit 21 includes an inverter (buffer) coupled in parallel with a resistor between X1 and X2 to generate Clk_0 and to generate a feedback clock signal at X2. Clk_0 is input to phase locked loop (PLL) circuit 22 that uses the Clk_0 signal to generate the first periodic signal Clk_1.

In embodiments of the present invention timing devices 10, 10a may include one or more frequency divider 8 for varying the frequency of the first periodic signal and the second periodic signal. One or more frequency divider 8 may be electrically coupled to receive an input clock signal and is operable to divide the input clock signal to generate a divided clock signal. In one embodiment the one or more frequency divider 8 is disposed within PLL 22 to generate Clk_1 having a frequency $f_1$.

Selection logic 5 is electrically coupled to input terminal 1, output terminal 6, OTP NVM 2, first periodic signal generator 3 and second periodic signal generator 4. Input terminal 1, output terminal 6, OTP NVM 2, selection logic 5, first periodic signal generator 3 and second periodic signal generator 4 may be formed on a single semiconductor die.

Figure 3:
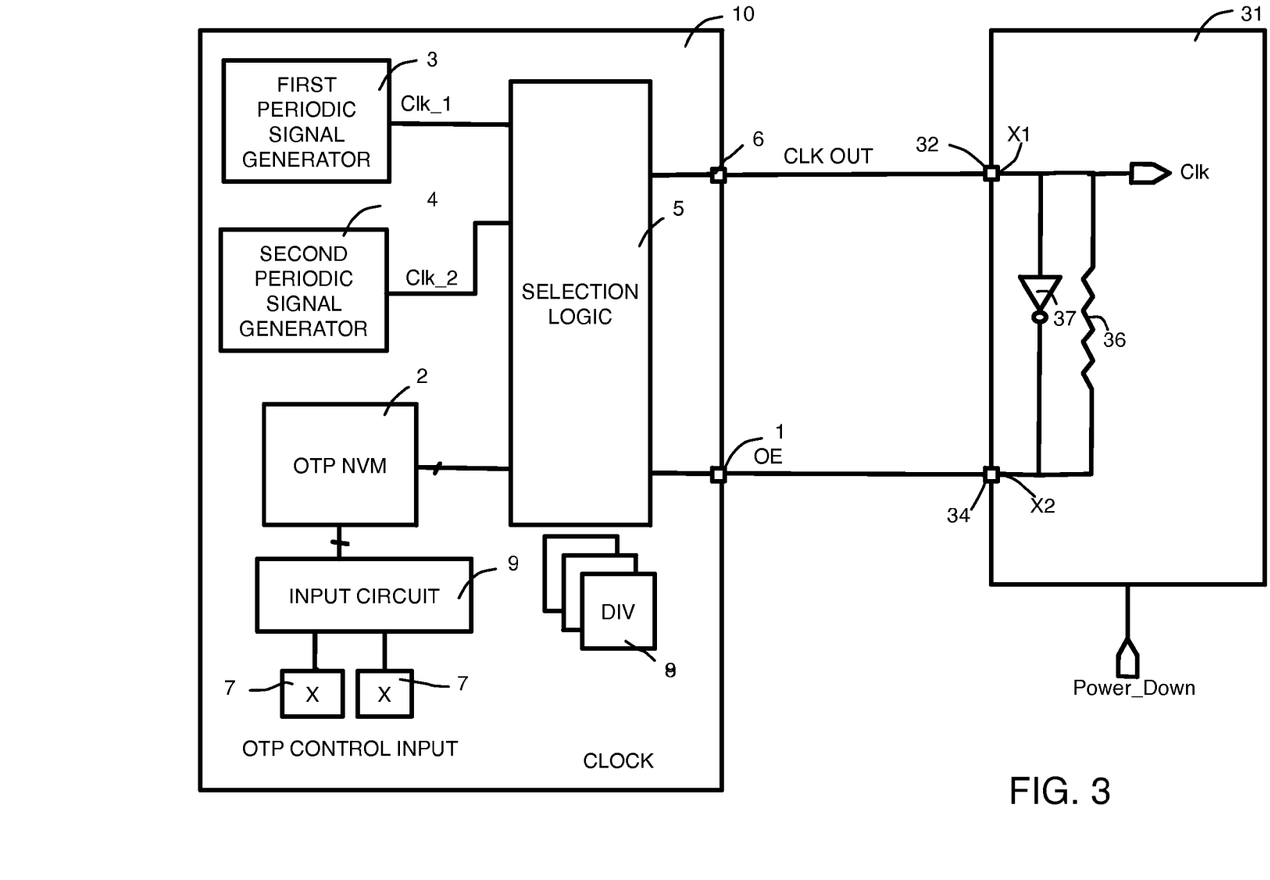
FIG. 3 is a clock distribution system that includes a timing device and a integrated circuit device configured to be electrically coupled to a piezoelectric crystal in accordance with an embodiment of the present invention.
Figure 4:
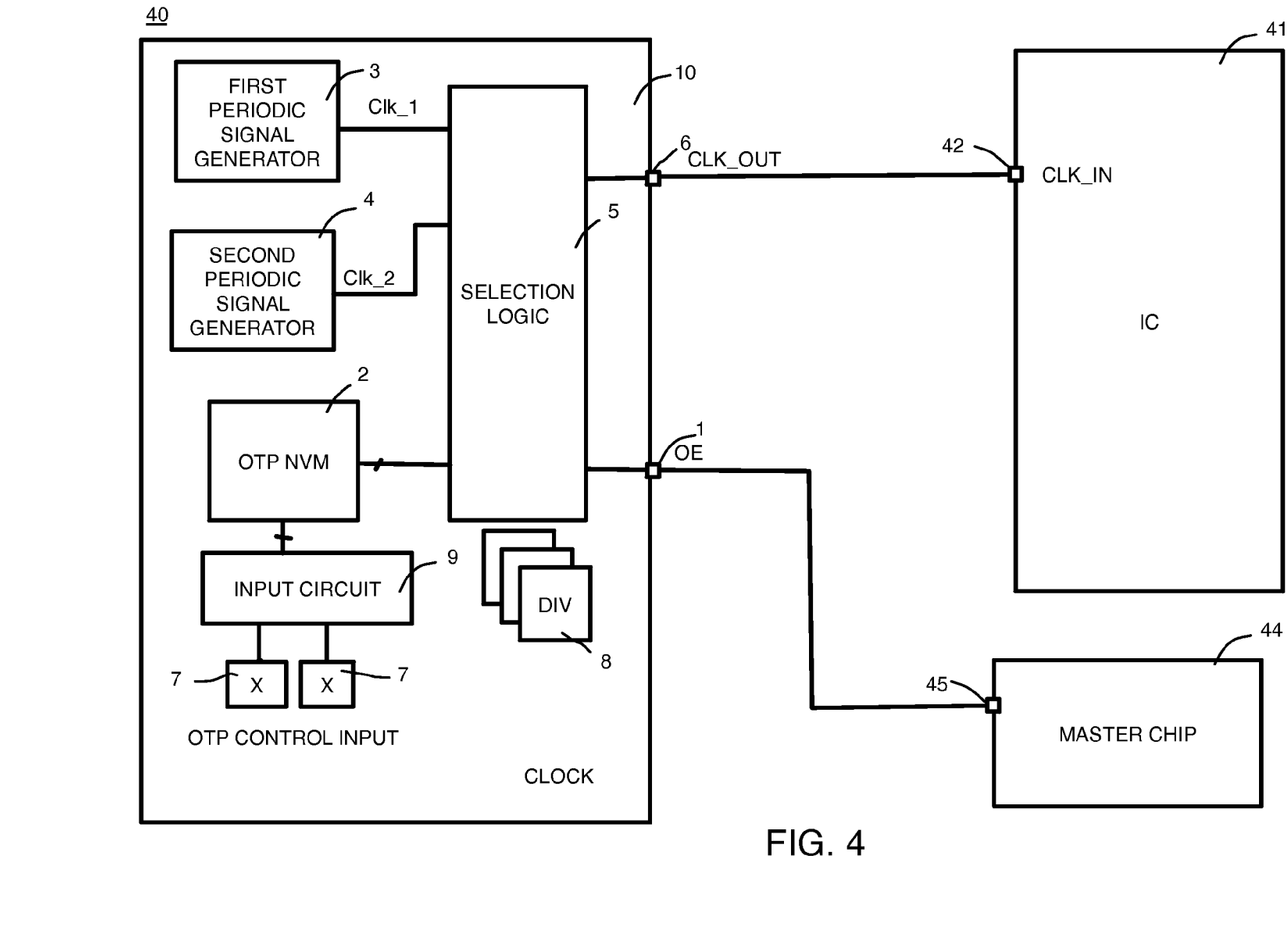
FIG. 4 is a clock distribution system that includes a timing device, a integrated circuit device configured to be electrically coupled to a conventional integrated circuit timing device and a master integrated circuit (Master Chip) in accordance with an embodiment of the present invention.

Timing device 10, 10a is configured to be used both as a crystal replacement timing device (e.g., a crystal replacement clock) and as a conventional integrated circuit timing device (e.g., a conventional integrated circuit clock). FIGS. 3-4 illustrate the use of timing devices 10, 10a as both a crystal replacement clock (FIG. 3) and as a conventional integrated circuit clock (FIG. 4). It is appreciated that, though timing device 10 is shown in FIGS. 3-4, alternatively, timing device 10a could be used.

Referring now to FIG. 3, a clock distribution system 30 is shown that includes timing device 10 that is electrically coupled an integrated circuit device 31 having a crystal driver input terminal (X1) 32 and crystal driver output terminal (X2) 34. More particularly, crystal driver input terminal 32 is electrically coupled to output terminal 6 and crystal driver output terminal 34 is electrically coupled to input terminal 1. In this embodiment the configuration data stored in OTP NVM 2 of timing device 10 indicates the proactive (first) operating mode so as to operate timing device 10 as a crystal replacement clock.

Crystal driver input terminal 32 and crystal driver output terminal 34 are configured to be attached to a piezoelectric crystal and are electrically coupled to a crystal oscillator circuit within integrated circuit device 31 that includes a feedback buffer 37 and a resistor 36 coupled in parallel between the crystal driver input terminal 32 and crystal driver output terminal 34 to generate a clock signal (Clk) in integrated circuit 31. It can be seen that integrated circuit device 31 includes an input for receiving the Power_Down signal and that timing device 10 does not include an input for receiving the Power_Down signal.

The first periodic signal (e.g., high frequency clock) 3 is sufficient to operate the internal synchronizing clock Clk within integrated circuit device 30. Second periodic signal generator 4 is configured to generate the second periodic signal having a duty cycle (CLK_2) less than 50% which is sufficient to provide a sufficient combination of frequency and duty cycle (i. e., active energy) to support switching of the feedback buffer 37 when integrated circuit device 31 is fully powered but insufficient to operate as the internal synchronizing clock Clk within integrated circuit device 31 as it is insufficient to generate any switching waveform at crystal driver output terminal 34 when integrated circuit device 31 is powered down such that feedback buffer 37 is disabled.

Referring now to FIG. 4, a clock distribution system 40 is shown that includes timing device 10 that is electrically coupled an integrated circuit device 41 having a clock input terminal (CLK_IN) 42. More particularly, clock input terminal 42 is electrically coupled to output terminal 6. It is appreciated that integrated circuit device 41 does not include a crystal driver output terminal or a crystal driver input terminal. Furthermore, integrated circuit device 41 will not include a crystal oscillator circuit that connects to a clock input terminal as is required in the embodiment shown in FIG. 3. Input terminal 1 is electrically coupled to terminal 45 of master chip 44 that generates the output enable signal. The configuration data stored in OTP NVM 2 indicates the normal (second) operating mode so that timing device 10 operates as a conventional integrated circuit timing device.

Figure 5:
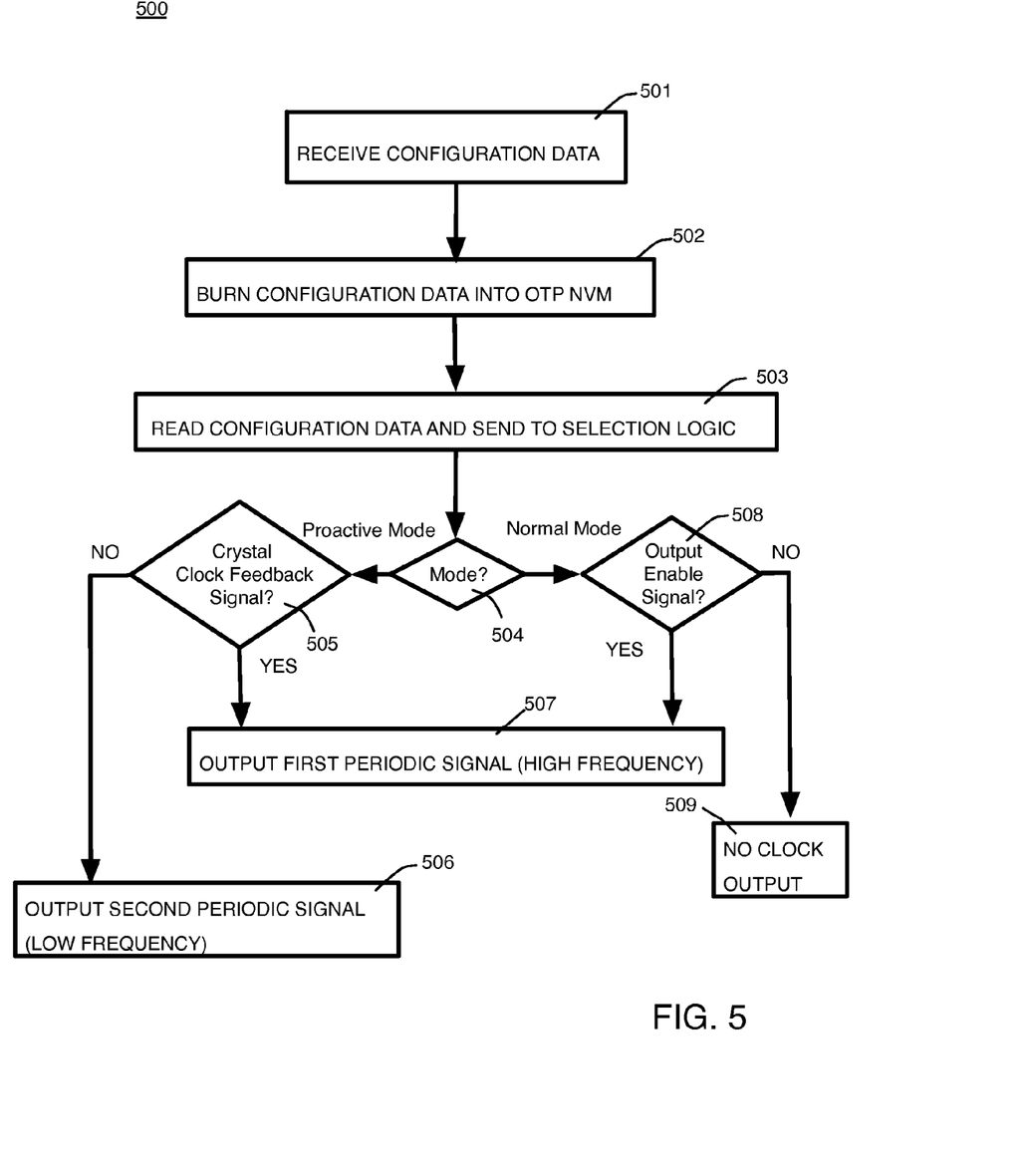
FIG. 5 is a block diagram showing a method for controlling operation of a timing device in accordance with an embodiment of the present invention.

Referring now to FIG. 5 a method for controlling operation of a timing device is disclosed that includes storing in the timing device one or more bit indicating an operating mode as shown by steps 501-502. The method includes receiving 501 configuration data at a timing device and burning 502 the configuration data into a OTP NVM. In the embodiments shown in FIGS. 1-4 configuration data that includes one or more bit indicating an operating mode can be received at OTP control input 7 and an OTP NVM programming voltage, which is a higher voltage than the operating voltage of timing devices 10, 10a, is received at input terminal 1 to program the configuration data into OTP NVM 2. In this embodiment OTP NVM 2 is electrically coupled to input terminal 1 and includes programming logic electrically coupled to the programmable fuses that selectively applies the OTP NVM programming voltage to the programmable fuses during programming so as to "burn" the configuration data into the OTP NVM.

In one embodiment steps 501-502 are performed once to install a complete timing device configuration in OTP NVM 2 that includes the one or more mode selection bit that indicates the operating mode. Alternatively, only the one or more mode selection bits are stored in steps 501-502 and the remainder of the timing device configuration is separately received as input.

The configuration data is read and is sent to the selection logic of the timing device as shown by step 503. In the embodiment of FIGS. 1-4 OTP NVM 2 is operable to read the configuration data, which is in this case one or more bit that indicates an operating mode, and send the one or more bit to selection logic 5.

In alternate embodiments other types of nonvolatile memory could be used instead of OTP NVM 2, or a timing device 10 can be used that requires that the configuration data that includes the one or more bit that indicates operating mode be reloaded at each initialization of timing device 10 and stored in volatile memory (e.g., RAM) of timing device 10.

As shown by steps 504-505 and 507, when the configuration data indicates a first operating mode that can be referred to as the "proactive mode," the timing device outputs at an output terminal a first periodic signal having a first frequency as long as a crystal clock feedback signal is received at the input terminal. As shown by steps 504-506, when the crystal clock feedback signal is not received at the input terminal the timing device outputs at the output terminal a second periodic signal having a second frequency that is less than the first frequency. In the embodiment shown in FIG. 4, when integrated circuit device 31 receives the Power_Down signal it goes into a low-power mode, cutting off power to the crystal oscillator circuit such that input received at crystal driver input terminal 32 no longer generates a crystal clock feedback signal at crystal driver output circuit 34. Accordingly, the crystal clock feedback signal will not be received at input terminal 1 and timing device 10 will automatically switch to a power saving mode in which the second periodic signal is output at output terminal 6. More particularly, selection logic 5 is configured to receive configuration data read from OTP NVM 2 and, when the configuration data indicates the proactive (first) operating mode, selection logic 5 is configured to output the first periodic signal (Clk_1) at output terminal 6 as long as a crystal clock feedback signal is received at input terminal 1 and is configured to output the second periodic signal (Clk_2) when the crystal clock feedback signal is not received at input terminal 1.

As shown by steps 504, 507-508, when the configuration data indicates a second operating mode that can be referred to as the "normal mode," the timing device outputs the first periodic signal as long as a output enable signal is received at the input terminal. As shown by steps 504 and 508-509 the timing device does not provide any output at the output terminal when the output enable signal is not received at the input terminal. In the embodiment shown in FIGS. 1-4 selection logic 5 is configured to output the first periodic signal (Clk_1) as long as a output enable signal is received at input terminal 1 and not provide any output at output terminal 6 when the output enable signal is not received at input terminal 1.

Because input terminal 1 is used for both electrically connecting to terminal 34 to receive the x2 signal and electrically connecting to terminal 45 for receiving the output enable signal, a dedicated terminal configured to receive the output enable signal is not required, reducing pin count, reducing footprint and cost of timing device 1. Furthermore, the use of input terminal 1 for receiving the OTP NVM programming voltage provides further multifunctional use of the single input terminal 1.

Moreover the method and apparatus of the present invention allows for timing device 10 to be used as a crystal replacement clock having a low power mode even though timing device 10 does not have any input terminal that receives the Power_Down signal that indicates global power down of the system as is illustrated in FIG. 3. More particularly, the proactive mode allows for power savings based on the active sensing of the crystal driver output terminal and timing device 10 automatically goes into low power mode by switching to use of the second periodic signal generator as a clock source, without actually receiving the Power_Down signal that indicates global power down of the system.

In embodiments of the present invention, in the second operating mode, when the operation enable signal is deasserted the clock enters a maximum power savings mode. In the maximum power saving mode both the first periodic signal generator and the second periodic signal generator are powered down and all outputs are disabled. In one embodiment the maximum power saving mode is configurable by the user and can either power down the first periodic signal generator or operate the first periodic signal generator at a reduced power/frequency (e.g., by reducing power to a voltage controlled oscillator of the first periodic signal generator 1).

Figure 6:
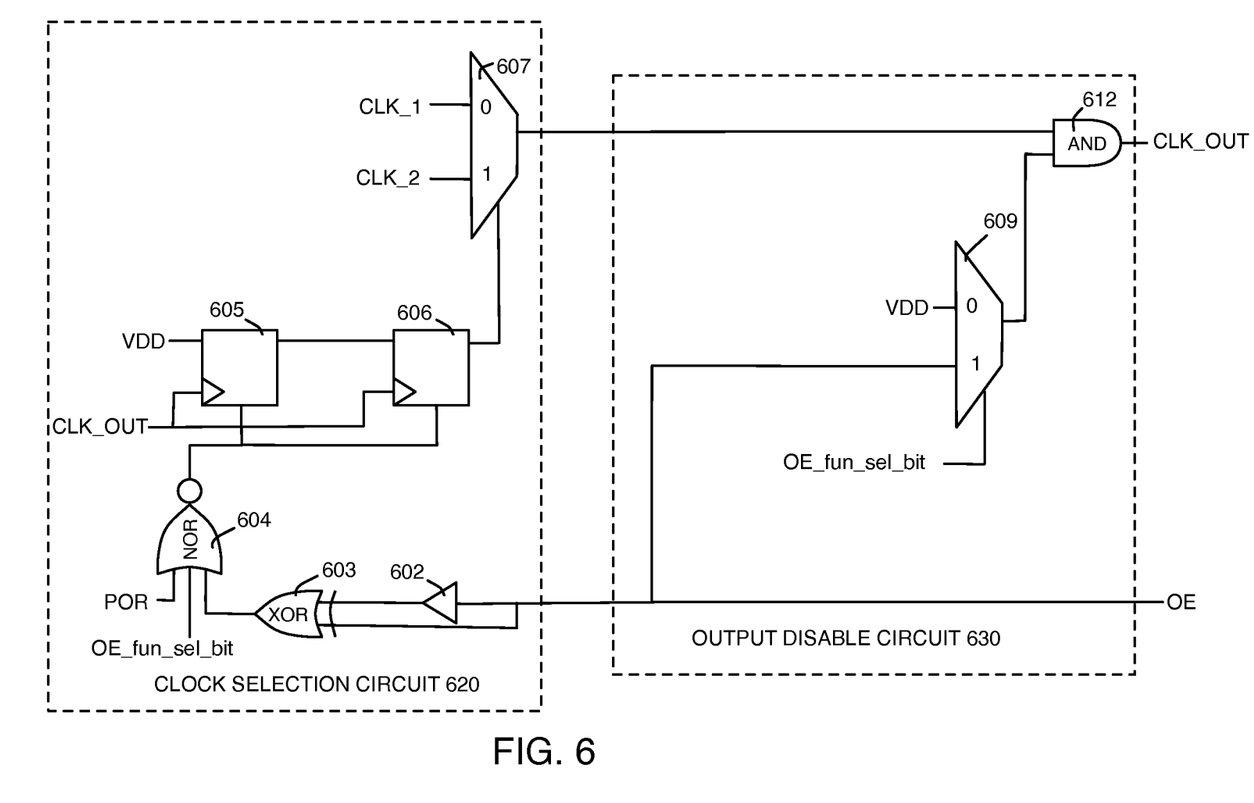
FIG. 6 is a block diagram showing selection logic in accordance with an embodiment of the present invention.

FIG. 6 shows an exemplary embodiment illustrating the selection logic 5 that includes clock selection circuit 620 that is configured to receive a signal from the input terminal 1 for selecting a clock source based on the operating mode. Selection logic 5 also includes an output disable circuit 630 for disabling the output of the selected clock source based on the signal received at input terminal 1 and the operating mode.

The clock selection circuit includes amplifier (delay buffer) 602, XOR gate 603, NOR gate 604, D flip-flops 605-606 and multiplexer 607. Amplifier 602 (delay buffer) has an input electrically coupled to input terminal 1 and has an output electrically coupled to an input of XOR gate 603.

XOR gate 603 has a second input electrically coupled to input terminal 1. The output of XOR gate 603 is electrically coupled to a first input of NOR gate 604 and a second input of NOR gate 604 is electrically coupled to receive a Power-on-Reset signal (POR). In this embodiment the configuration data comprises an operating mode selection bit (OE_fun_sel_bit) that indicates the operating mode. A third input of the NOR gate 604 is electrically coupled to OTP NVM 2 for receiving the OE_fun_sel_bit. NOR gate 604 is operable to generate output that is electrically coupled to a reset pin of each D flip-flop 605-606 that is an active low reset. The single-ended output signal CLK_OUT is fed back to clock flip-flops 605-606. Flip-flop 605 has a first input electrically coupled to receive a supply voltage (VDD) and an output electrically connected to a first input of flip-flop 606, generating a clock-source-select control signal at the output of flip-flop 606 that is electrically coupled to select terminal of multiplexer 607. A first input of multiplexer 607 is electrically coupled to the first periodic signal generator to receive the Clk_1 signal and a second input of multiplexer 607 is electrically coupled to the output of second periodic signal generator 4 to receive the Clk_2 signal and is responsive to the clock-source-select control signal to couple Clk_1 or Clk_2 to an output of multiplexer 607.

In the present embodiment an OE_fun_sel_bit having a value of 1 indicates a normal operating mode and a OE_fun_sel_bit having a value of "0" indicates a proactive mode. In the normal operating mode (OE_fun_sel_bit=1) a logical low is generated at the output of NOR gate 604, both when the output enable signal is asserted and when it is deasserted such that first periodic signal generator 3 is selected. In the proactive operating mode since the OE_fun_sel_bit=0, input into NOR gate 604 is 0, the pulse train generated by delay buffer 602 and XOR gate 603 will generate a corresponding output signal at the output of NOR gate 604 such that when the crystal clock feedback signal is received the clock-source-select control signal goes to 0 and clock selection circuit outputs Clk_1, and when the crystal clock feedback signal is deasserted the clock-source-select control signal will go to 1 so as to select Clk_2.

The output disable circuit 630 includes multiplexer 609 and AND gate 612. Multiplexer 609 has a first input electrically coupled to input terminal 1. Multiplexer 609 has a second input electrically coupled to receive supply voltage VDD and a select terminal electrically coupled to OTP NVM 2 for receiving the OE_fun_sel_bit. Multiplexer 609 is responsive to the OE_fun_sel_bit to output either the signal input at terminal 1 or VDD. Multiplexer 609 has an output electrically coupled to a first input of AND gate 612. AND gate 612 has an output electrically coupled to output terminal 6. In the normal operating mode (OE_fun_sel_bit=1) when the output enable signal is not received at input terminal 1 (deasserted) a logical low is generated at the output of multiplexer 609 such that AND gate 612 does not generate output at output terminal 6. In the normal operating mode, when the output enable signal is received at input terminal 1 (e.g., a logical high), a logical high is generated at the output of multiplexer 609, coupling the output of multiplexer 607 to output terminal 6 to generate output clock signal CLK OUT.

In the proactive operating mode (OE_fun_sel_bit=0) positive supply voltage VDD is coupled to the output of multiplexer 609 such that AND gate 612 couples the output of multiplexer 607 to the output terminal to generate output clock signal CLK OUT. Accordingly, as previously discussed, in the proactive operating mode (OE_fun_sel_bit=0), when the crystal clock feedback signal is received, the clock selection circuit outputs Clk_1 which is coupled to output terminal 6 and when the crystal clock feedback signal is not received, the clock selection circuit outputs Clk_2 at the output of multiplexer 607 such that AND gate 612 couples Clk_2 to the output terminal to generate output clock signal CLK OUT.

It is appreciated that timing device circuit 10, 10a can have any of a number of different designs and may be specialized for any of a number of different purposes. In one embodiment the loaded timing device configuration includes output format parameters for controlling the output format of the output timing signals. The output format parameters can indicate, for example LVPECL, LVDS, HCSL, CML, HSTL, or other selectable outputs. The loaded timing device configuration can also include parameters for controlling additional PLL circuits and parameters for controlling one or more of frequency dividers 8 to generate additional outputs at other output terminals, where the circuitry for generating the additional outputs may have some or all of the features shown in FIGS. 1-6.

In the present embodiment, timing device 10 is an Application-Specific Integrated Circuit (ASIC) formed on a single semiconductor die. Accordingly, input terminal 1, output terminal 6, OTP NVM 2, selection logic 5, first periodic signal generator 3 and second periodic signal generator 4 are disposed on a single semiconductor die.

As is known in the art, the methods and apparatus of the present invention may be implemented in a Field Programmable Gate Array (FPGA), an Application-Specific Integrated Circuit (ASIC) or a variety of other commonly known integrated circuit devices. The implementation of the invention may include both hardware and software components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A timing device comprising:
   an input terminal;
   an output terminal;
   a data storage device configured to store one or more operating mode selection bit; and
   a first periodic signal generator operable to generate a first periodic signal having a first frequency at an output thereof;
   a second periodic signal generator operable to generate a second periodic signal having a second frequency at an output thereof, the second frequency lower than the first frequency; and
   selection logic electrically coupled to the input terminal, the output terminal, the data storage device, the first periodic signal generator and the second periodic signal generator, the selection logic configured to receive the one or more operating mode selection bit from the data storage device, and when the configuration data indicates a first operating mode the selection logic configured to output the first periodic signal at the output terminal as long as a crystal clock feedback signal is received at the input terminal and output the second periodic signal at the output terminal when the crystal clock feedback signal is not received at the input terminal, and when the one or more operating mode selection bit indicates a second operating mode the selection logic configured to output the first periodic signal as long as a output enable signal is received at the input terminal and not provide any output at the output terminal when the output enable signal is not received at the input terminal.

2. The timing device of claim 1 wherein the selection logic further comprises:
a clock selection circuit operable to select either the first periodic signal or the second periodic signal as output based on the one or more operating mode selection bit and the input received at the input terminal; and
an output disable circuit operable to disable the output at the output terminal based on the one or more operating mode selection bit and the input received at the input terminal.

3. The timing device of claim 1 wherein the duty cycle of the second periodic signal is less than the duty cycle of the first periodic signal.

4. The timing device of claim 3 wherein the second periodic signal has a duty cycle that is less than 50%.

5. The timing device of claim 1 wherein the first periodic signal generator comprises a crystal oscillator circuit configured to be electrically coupled to a piezoelectric crystal and a phase locked loop (PLL) circuit electrically coupled to the crystal oscillator circuit and operable for generating the first periodic signal.

6. The timing device of claim 5 further comprising at least one frequency divider electrically coupled to receive an input clock signal and operable to divide the input clock signal to generate the first clock signal.

7. The timing device of claim 1 wherein the date storage device comprises a one time programmable non volatile memory (OTP NVM) operable to receive configuration data that includes the one or more operating mode selection bit and operable to burn the configuration data into the OTP NVM so as to store the one or more operating mode selection bit in the OTP NVM.

8. The timing device of claim 7 wherein the OTP NVM, the selection logic, the first periodic signal generator and the second periodic signal generator are formed on a single semiconductor die.

9. The timing device of claim 1 wherein the second frequency is between 1 KHz and 40 KHz.

10. The timing device of claim 1 wherein the timing device is configured to be electrically coupled to an integrated circuit device having a crystal driver input terminal and a crystal driver output terminal to provide an output clock signal that corresponds to the output clock signal generated by a piezoelectric crystal, and is also configured to be electrically coupled to an integrated circuit device having a clock terminal configured to receive a conventional clock signal, the timing device not including an additional input terminal configured to receive a Power_Down signal.

11. The timing device of claim 1 wherein the date storage device comprises a one time programmable non volatile memory (OTP NVM) operable to receive configuration data and operable to burn the configuration data into the OTP NVM so as to store configuration data in the OTP NVM that includes the one or more operating mode selection bit, wherein the input terminal is operable in a OTP NVM burn mode to receive a high voltage signal for burning the configuration data into the OTP NVM.

12. A clock distribution system, comprising:
a first integrated circuit device selected from the group consisting of an integrated circuit device having a crystal driver input terminal and crystal driver output terminal, and an integrated circuit device having a clock input terminal and not having a crystal driver output terminal; and
a timing device comprising:
an input terminal;
an output terminal;
a one time programmable non volatile memory (OTP NVM) operable to receive configuration data including one or more operating mode selection bit and operable to burn the configuration data into the OTP NVM so as to store the configuration data in the OTP NVM;
a first periodic signal generator operable to generate a first periodic signal having a first frequency at an output thereof;
a second periodic signal generator operable to generate a second periodic signal having a second frequency at an output thereof, the second frequency lower than the first frequency and the duty cycle of the second periodic signal lower than the duty cycle of the first periodic signal;
selection logic electrically coupled to the input terminal, the output terminal, the OTP NVM, the first periodic signal generator and the second periodic signal generator, the selection logic configured to receive configuration data read from the OTP NVM, and when the first integrated circuit device is an integrated circuit device having a crystal driver input terminal and a crystal driver output terminal, the output terminal is electrically coupled to the crystal driver input terminal and the input terminal is electrically coupled to the crystal driver output terminal, and when the configuration data indicates a first operating mode the selection logic configured to output the first periodic signal at an output terminal as long as a crystal clock feedback signal is received at the input terminal and output the second periodic signal when the crystal clock feedback signal is not received at the input terminal; and
wherein, when the first integrated circuit device is an integrated circuit device having a clock input terminal and not having a crystal driver output terminal, the output terminal is electrically coupled to the clock input terminal and the input terminal is electrically coupled to receive an output enable signal, and when the configuration data indicates a second operating mode the selection logic configured to output at the output terminal the first periodic signal as long as an output enable signal is received at the input terminal and not provide any output at the output terminal when the output enable signal is not received at the input terminal.

13. The timing device of claim 12 wherein the first periodic signal generator comprises a crystal oscillator circuit configured to be electrically coupled to a piezoelectric crystal and a phase locked loop (PLL) circuit electrically coupled to the crystal oscillator circuit and operable for generating the first periodic signal.

14. The timing device of claim 12 further comprising at least one frequency divider electrically coupled to receive an input clock signal and operable to divide the input clock signal to generate the first clock signal.

15. The timing device of claim 12 wherein the OTP NVM, the selection logic, the first periodic signal generator and the second periodic signal generator are formed on a single semiconductor die.

16. A method for controlling operation of a timing device comprising:
- storing in the timing device one or more bit indicating an operating mode;
- when the configuration data indicates a first operating mode outputting a first periodic signal having a first frequency at an output terminal as long as a crystal clock feedback signal is received at an input terminal and outputting a second periodic signal having a second frequency that is less than the first frequency when the crystal clock feedback signal is not received at the input terminal; and
- when the configuration data indicates a second operating mode outputting the first periodic signal as long as a output enable signal is received at the input terminal and not providing any output at the output terminal when the output enable signal is not received at the input terminal.

17. The method of claim 16 wherein the configuration data comprises a single bit that indicates one of the first operating mode or the second operating mode.

18. The method of claim 16 wherein the configuration data indicates the first operating mode, the method further comprising coupling the timing device to an integrated circuit device having a crystal driver input terminal and crystal driver output terminal.

19. The method of claim 17 wherein the configuration data indicates the second operating mode, the method further comprising:
- coupling the timing device to a first integrated circuit device having a clock input terminal and not having a crystal driver output terminal; and
- coupling the timing device to a second integrated circuit device operable to generate the output enable signal.

20. The method of claim 16 wherein the storing in the timing device one or more bit indicating an operating mode further comprises:
- receiving at the timing device configuration data including the one or more bit indicating an operating mode; and
- burning the configuration data into a one time programmable non volatile memory (OTP NVM.

* * * * *